(12) United States Patent  
Wang et al.

(10) Patent No.: US 8,286,674 B2
(45) Date of Patent: Oct. 16, 2012

(54) GAS FILLING APPARATUS

(75) Inventors: Sheng-Hung Wang, Shulin (TW); Ming-Long Chiu, Shulin (TW)

(73) Assignee: Gudeng Precision Industrial Co., Ltd., New Taipei (TW)

( * ) Notice: Subject to any disclaimer, the term of this patent is extended or adjusted under 35 U.S.C. 154(b) by 997 days.

(21) Appl. No.: 12/272,985

(22) Filed: Nov. 18, 2008

(65) Prior Publication Data

US 2009/0159151 A1   Jun. 25, 2009

(30) Foreign Application Priority Data

Dec. 20, 2007  (TW) .............................. 96149057 A

(51) Int. Cl.
*B65B 1/04*  (2006.01)

(52) U.S. Cl. ................. 141/85; 141/66; 141/95; 141/98

(58) Field of Classification Search ............. 141/98, 141/39, 4, 95, 94, 348, 113, 85, 65, 66
See application file for complete search history.

(56) References Cited

U.S. PATENT DOCUMENTS

| 4,153,083 | A | * | 5/1979 | Imler et al. ................. 141/4 |
| 4,609,103 | A |   | 9/1986 | Bimer et al. |
| 4,664,479 | A |   | 5/1987 | Hiroshi |
| 4,724,874 | A | * | 2/1988 | Parikh et al. ................ 141/98 |
| 4,995,430 | A |   | 2/1991 | Bonora et al. |
| 5,482,161 | A | * | 1/1996 | Williams et al. ............ 206/711 |
| 5,810,062 | A | * | 9/1998 | Bonora et al. ................ 141/351 |
| 5,873,468 | A |   | 2/1999 | Ejima et al. |
| 5,879,458 | A |   | 3/1999 | Roberson, Jr. et al. |
| 5,988,233 | A | * | 11/1999 | Fosnight et al. ................ 141/63 |
| 6,032,802 | A |   | 3/2000 | Ejima et al. |
| 6,042,651 | A |   | 3/2000 | Roberson, Jr. et al. |
| 6,056,026 | A |   | 5/2000 | Fosnight et al. |
| 6,105,781 | A |   | 8/2000 | Ejima et al. |
| 6,135,168 | A | * | 10/2000 | Yang et al. .................. 141/98 |
| 6,135,170 | A | * | 10/2000 | Lee et al. ..................... 141/196 |
| 6,164,664 | A |   | 12/2000 | Fosnight et al. |
| 6,187,182 | B1 |  | 2/2001 | Reynolds et al. |
| 6,221,163 | B1 |  | 4/2001 | Roberson, Jr. et al. |
| 6,319,297 | B1 |  | 11/2001 | Fosnight |
| 6,357,491 | B1 | * | 3/2002 | Buchanan et al. ............ 141/4 |
| 6,368,411 | B2 |  | 4/2002 | Roberson, Jr. et al. |
| 6,457,494 | B1 | * | 10/2002 | Gregg et al. ................. 141/4 |

(Continued)

FOREIGN PATENT DOCUMENTS

TW           200413666           8/2004

(Continued)

*Primary Examiner* — Timothy L Maust
(74) *Attorney, Agent, or Firm* — Chun-Ming Shih; HDLS IPR Services

(57) ABSTRACT

A gas filling apparatus for filling a gas into a storage apparatus for storing a semiconductor element or a reticle is provided. The gas filling apparatus is connected with an air feed source, which includes a base, a first inlet port and a set of air feed source route. The storage apparatus is loaded on the base, and the first inlet port which is disposed on the base corresponds with the second inlet port of the storage apparatus. The set of air feed source route includes an entrance part, a supply part and a branch part. The entrance part is connected with the air feed source, and the supply part is connected with the first inlet port. The branch part is a closed loop, which transmits the gas from the entrance part into the supply part.

17 Claims, 7 Drawing Sheets

U.S. PATENT DOCUMENTS

| | | | |
|---|---|---|---|
| 6,539,989 B1 * | 4/2003 | Walden | 141/106 |
| 6,758,876 B2 * | 7/2004 | Suzuki et al. | 55/385.6 |
| 6,955,198 B2 * | 10/2005 | Wodjenski | 141/248 |
| RE39,241 E | 8/2006 | Fosnight | |
| 7,360,346 B2 * | 4/2008 | Miyajima et al. | 53/432 |
| 2005/0069420 A1 * | 3/2005 | Miyajima et al. | 417/53 |
| 2006/0060136 A1 * | 3/2006 | Kisakibaru et al. | 118/666 |
| 2007/0125441 A1 * | 6/2007 | Farese et al. | 141/2 |
| 2009/0165888 A1 * | 7/2009 | Wang et al. | 141/39 |

FOREIGN PATENT DOCUMENTS

TW          200741807        11/2007

\* cited by examiner

GAS FILLING APPARATUS

BACKGROUND OF THE INVENTION

1. Technical Field

The present invention relates to gas filling apparatuses, and more particularly, to a gas filling apparatus for filling a gas into a storage apparatus that is used for storing a semiconductor element or a reticle.

2. Description of Related Art

In the rapidly developing semiconductor technology, optical lithography plays an important role and wherever pattern definition is conducted, optical lithography is requisite. As to the application of optical lithography relating to semiconductors, a designed circuit pattern is used to produce a light-transparent reticle with a particular shape. Basing on the principle of exposure, after a light passes through the reticle to project on a silicon wafer, the circuit pattern formed on the reticle can be exposed onto the silicon wafer. Since any dust (such as particles, powders or an organic matter) can adversely affect the quality of such projected pattern, the reticle used to produce the pattern on the silicon wafers is required with absolute cleanness. Thus, clean rooms are typically employed in general wafer processes for preventing particles in the air from defiling reticles and wafers. However, absolute dustless environment is inaccessible even in the known clean rooms.

Hence, reticle storage apparatuses that facilitate protecting reticles from defilement are implemented in current semiconductor processes for the purpose of storage and transportation of reticles so as to ensure cleanness of the reticles. When such reticle storage apparatuses accommodate reticles in semiconductor processes, the reticles can be isolated from the atmosphere when being transferred and conveyed between stations, so as to be secured from defilement caused by impurities that induces deterioration. Further, in advanced semiconductor factories, the cleanliness of the storage apparatuses is required to meet the Standard Mechanical Interface (SMIF), namely superior to Class 1. One solution for achieving the required cleanliness is to fill gas into the storage apparatuses. In the known technology, an external gas filling apparatus is connected with the storage apparatus so as to allow a gas to be filled into the storage apparatus through the gas filling apparatus.

However, in the conventional gas filling apparatus, a straight air route is typically adopted, as shown in FIG. 7. In other words, the gas in the air feed source route is a prolongated integral from the air feed source to the endmost gas outlet. Consequently, at the gas outlet nearest the air feed source, the strongest gas pressure causes the maximum gas flow rate, while at the endmost gas outlet, the decreased gas flow performs the gas pressure inferior to that at the foremost gas outlet. Such conventional gas filling apparatus is disadvantageous by the excessive gas pressure at the front gas outlets causing an excessive gas flow to be filled into the storage apparatuses that brings the risk of damaging the reticle or semiconductor elements in the storage apparatuses and the poor gas flow in company with the poor gas pressure at the rear gas outlets that possibly renders insufficient gas filling or even failed gas filling. As a result, though the storage apparatuses are attached to the identical gas filling apparatus, the undesired gas pressure distribution causes irregular and unmanageable gas flows for the respective storage apparatuses and therefore results in increased manufacturing and managing costs. Hence, it would be an important task for the industry to equalize the flows of the gas filled into each storage apparatus.

Seeing that, the inventor of the present invention provides a gas filling apparatus to improve the current technology.

SUMMARY OF THE INVENTION

For remedying the above-mentioned technical problem, the present invention provides a gas filling apparatus having a closed loop for filling gas into a storage apparatus that is used for storing a semiconductor element or a reticle. The gas filling apparatus is connected with an air feed source, and includes a base, a first inlet port and a set of air feed source route. The storage apparatus is loaded on the base, and the first inlet port, which is disposed on the base, corresponds with the second inlet port of the storage apparatus. The set of air feed source route includes an entrance part, a supply part and a branch part. The entrance part is connected with the air feed source, and the supply part is connected with the first inlet port. The branch part for transferring the air from the entrance part into the supply part is formed as a closed loop.

Therefore, one objective of the present invention is to provide a gas filling apparatus with a set of air feed source route is a closed loop and facilitates stabilizing an overall gas pressure in the set of air feed source route.

Another objective of the present invention is to provide a gas filling apparatus with a set of air feed source route formed as a closed loop that facilitates equalizing the pressure and flow rate of gas at all extremes of the set of air feed source route.

Another objective of the present invention is to provide a gas filling apparatus with a pressure stabilizer that facilitates adjusting the pressure and flow rate of gas in the set of air feed source route so as to equalize pressure and flow rate of gas at all extremes of the set of air feed source route.

Another objective of the present invention is to provide a gas filling apparatus having a first sensing device that senses the pressure and flow rate of gas within set of air feed source route and communicates a signal to a pressure stabilizer that facilitates adjusting the pressure and flow rate so that the gas filling apparatus can control the pressure and flow rate of gas automatically in set of air feed source route.

Another objective of the present invention is to provide a gas filling apparatus having a switch device that can be turned on or turned off to enter the gas into the storage apparatus.

Yet another objective of the present invention is to provide a gas filling apparatus with a second sensing device that determines whether a storage apparatus is disposed correctly in position, and a signal is communicated to a switch device to turn on or turn off the gas, such that the gas can be controlled automatically into the storage apparatus by the gas filling apparatus.

Still another objective of the present invention is to provide a gas filling apparatus with a flow rate regulator to adjust the gas flow rate that enters into the storage apparatus so as to prevent an article in the storage apparatus from damage by exploded gas.

BRIEF DESCRIPTION OF THE DRAWINGS

The invention as well as a preferred mode of use, further objectives and advantages thereof, will best be understood by reference to the following detailed description of an illustrative embodiment when read in conjunction with the accompanying drawings, wherein.

DETAILED DESCRIPTION OF THE PREFERRED EMBODIMENT

While the present invention discloses a gas filling apparatus with a closed loop, it is to be stated first of all that the detailed manufacturing or processing procedures of the mentioned reticles, semiconductor elements, storage apparatuses and gas filling apparatuses relay on known technology and need not be discussed at length herein. Meantime, while the accompanying drawings are provided for purpose of illustration, it is to be understood that the components and structures therein need not to be made in scale.

Figure 1:
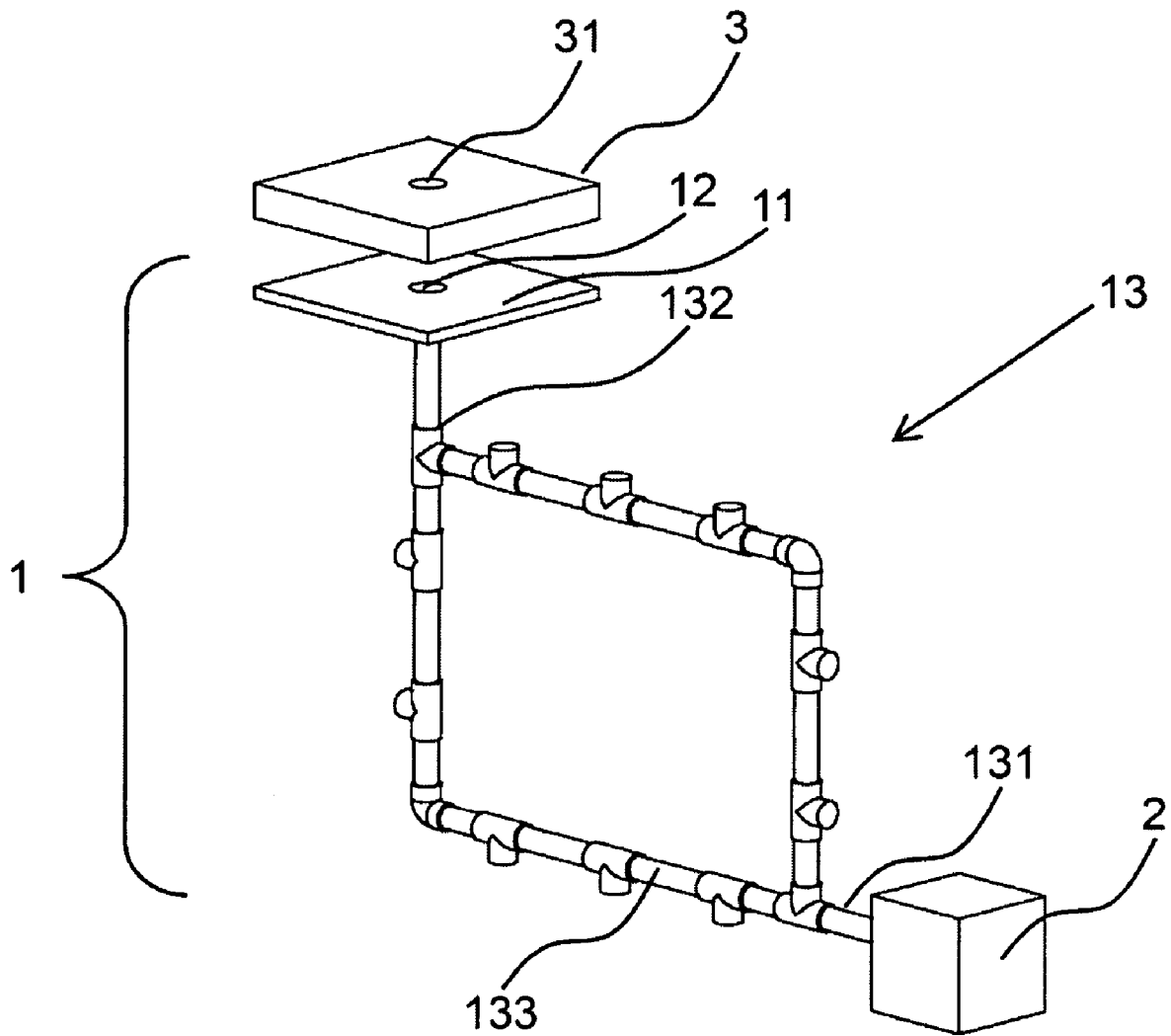
FIG. 1 is a schematic drawing of a gas filling apparatus of the present invention.

Please refer to FIG. 1 for a schematic drawing of a gas filling apparatus of the present invention. The gas filling apparatus 1 is connected with an air feed source 2 that is used for filling a gas into at least one storage apparatus 3 for storing a semiconductor element or a reticle. The storage apparatus 3 includes at least one first inlet port 31 to enter the gas into the storage apparatus 3.

The gas filling apparatus 1 includes at least one base 11, at least one second inlet port 12 and a set of air feed source route 13. The storage apparatus 3 is loaded on the base 11, and the first inlet port 31, which is disposed on the base 11 corresponding to the second inlet port 12 of the storage apparatus 3, thereby, the gas can flow through the first inlet port 31 via the second inlet port 12 to the storage apparatus 3. The feature of gas filling apparatus 1 is that the set of air feed source route 13 includes an entrance part 131 which is provided to connect with the air feed source 2, at least one supply part 132 which is provided to connect with the second inlet port 12, and a branch part 133 which is provided to introduce the gas from entrance part 131 into the supply part 132. The main feature of the set of air feed source route 13 is that the branch part 133 is a closed loop, and the pressure inside the closed loop is constant. Although the supply part 132 is disposed far away from the entrance part 131, the pressure of gas would be sufficiently to maintain the pressure of gas inside the entrance part 131 that flowed into the second inlet port 12.

Figure 2:
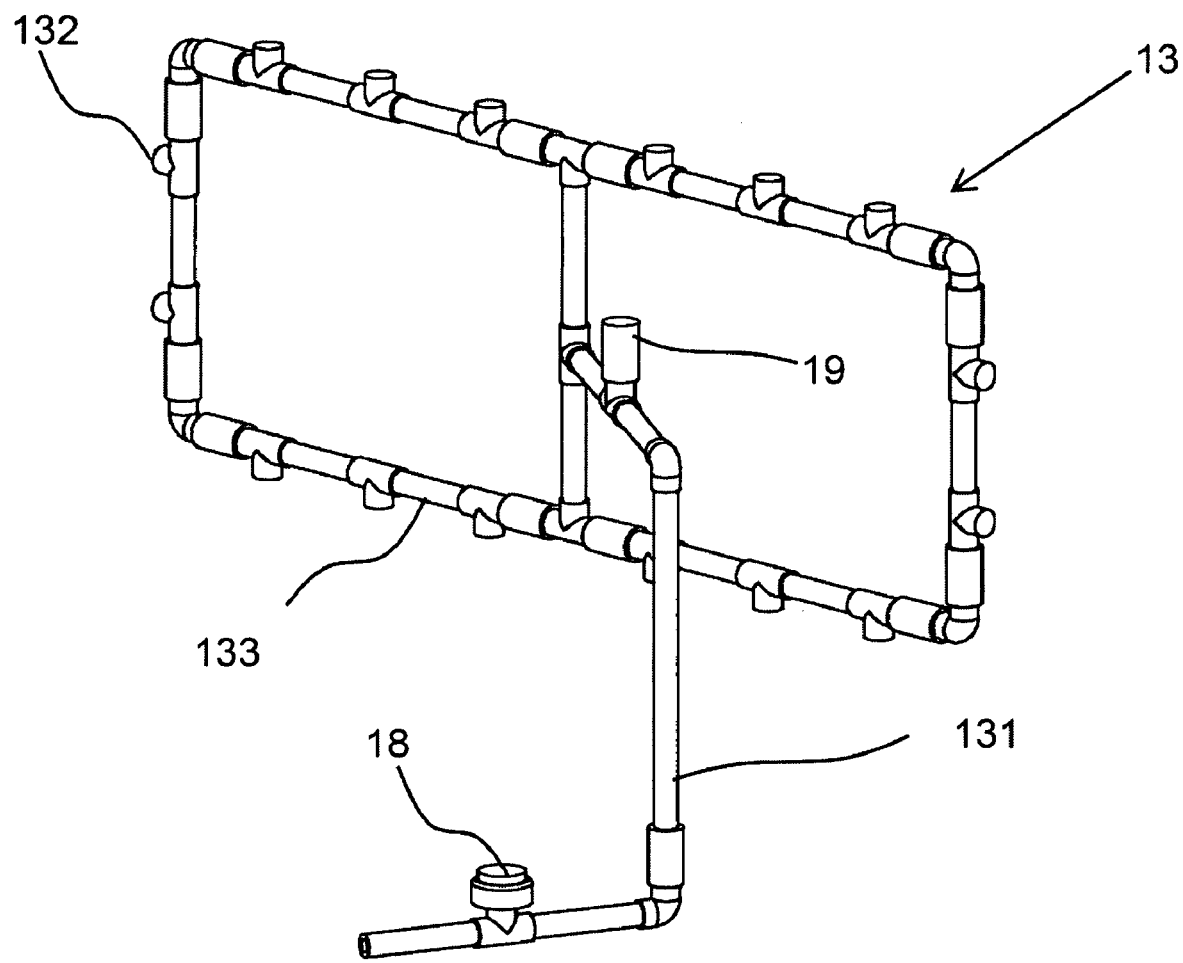
FIG. 2 is a schematic drawing of the gas filling apparatus added with a pressure stabilizer and a first sensing device according to the present invention.

Although the pressure would be kept constant inside the closed loop, the overall gas flow rate would be increased according to the increase of the amount of gas within the entrance part 131, thereby, the pressure inside the set of air feed source route 13 would be decreased and the pressure of the gas flowed into the storage apparatus 3 would also be decreased. Thus, the invention also provides a pressure stabilizer 18 (as shown in FIG. 2), which is disposed on the entrance part 131 of the set of air feed source route 13. The pressure stabilizer 18 used to adjust the pressure and the flow rate of the gas within the set of air feed source route 13. In this embodiment, the gas flow rate within the set of air feed source route 13 of the gas filling apparatus is kept constant. The pressure stabilizer 18 can adjust the gas flow rate within the set of air feed route 13 according to the amount of the gas flow rate, thus, the pressure within the set of air feed source route 13 can be kept constant. Meanwhile, the invention also provides a first sensing device 19 which is disposed on the entrance part 131 of the set of air feed source 13. The first sensing device 19 used to sense the pressure and the flow rate of the gas within the set of air feed source route 13. The first sensing device 19 is electrically connected within the pressure stabilizer 18, and the result of the pressure and the flow rate is sensed from the gas within the set of the air feed source route 13 that is communicated to the pressure stabilizer 18, so that the pressure stabilizer 18 can adjust the pressure and the flow rate of the gas within the set of air feed source route 13 and the pressure and the flow rate of the gas within the set of air feed source route 13 can be kept stability.

Figure 3:
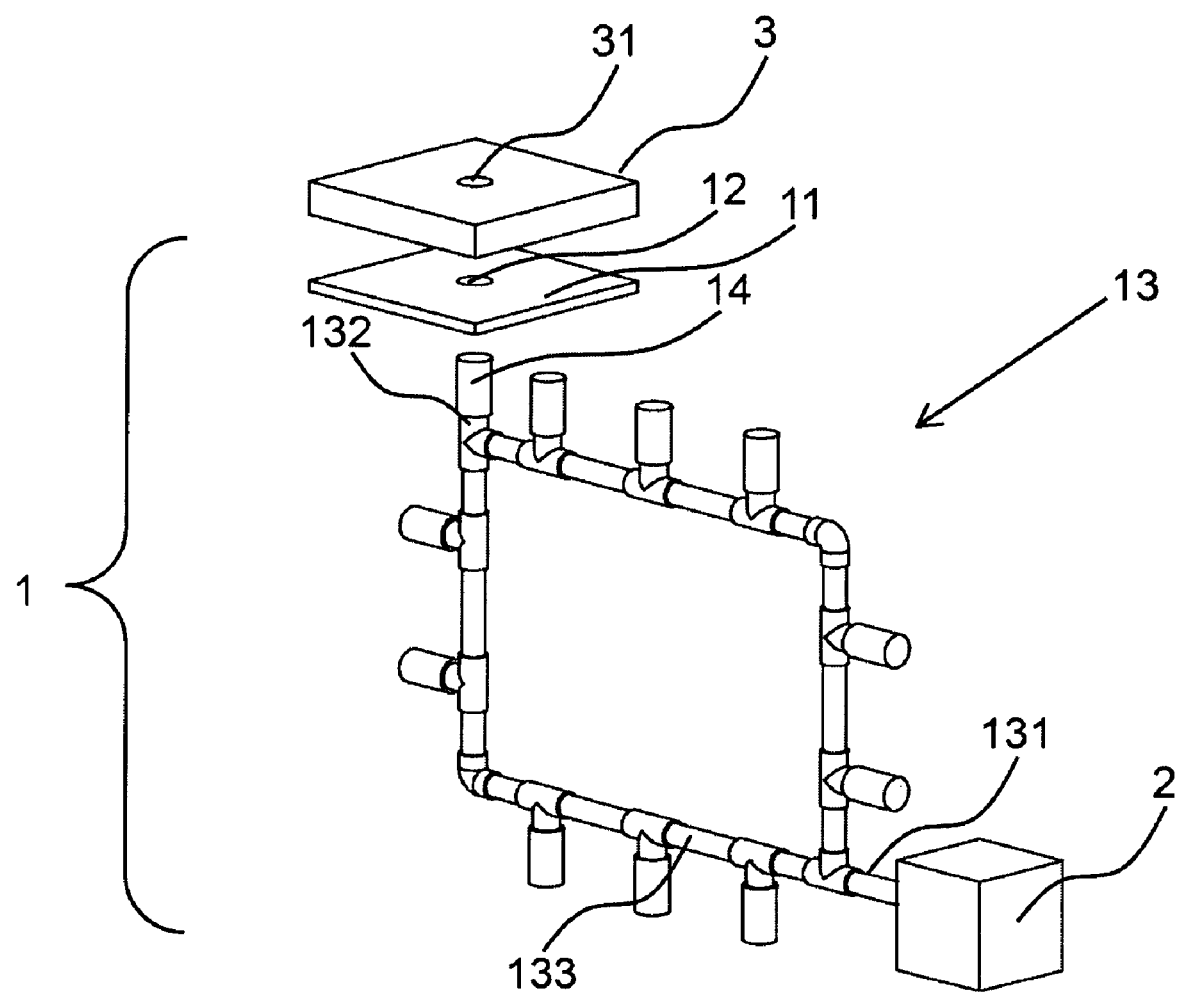
FIG. 3 is a schematic drawing of the gas filling apparatus added with a switch device according to the present invention.

Next, a switch device 14 can be provided in another embodiment of the present invention. The switch device 14 is connected with the supply part 132 that is used to introduce the gas turn on or turn off into the storage apparatus 3 as shown in FIG. 3. The switch device 14 can be an electromagnetic valve. When the storage device 3 is disposed on the base 11 of the gas filling apparatus 1, and the first inlet port 31 is aligned to the second inlet port 12 so as to the switch device 14 will be turned on to pass the gas within the supply part 132 via the second inlet port 12 to the storage apparatus 3.

Figure 4:
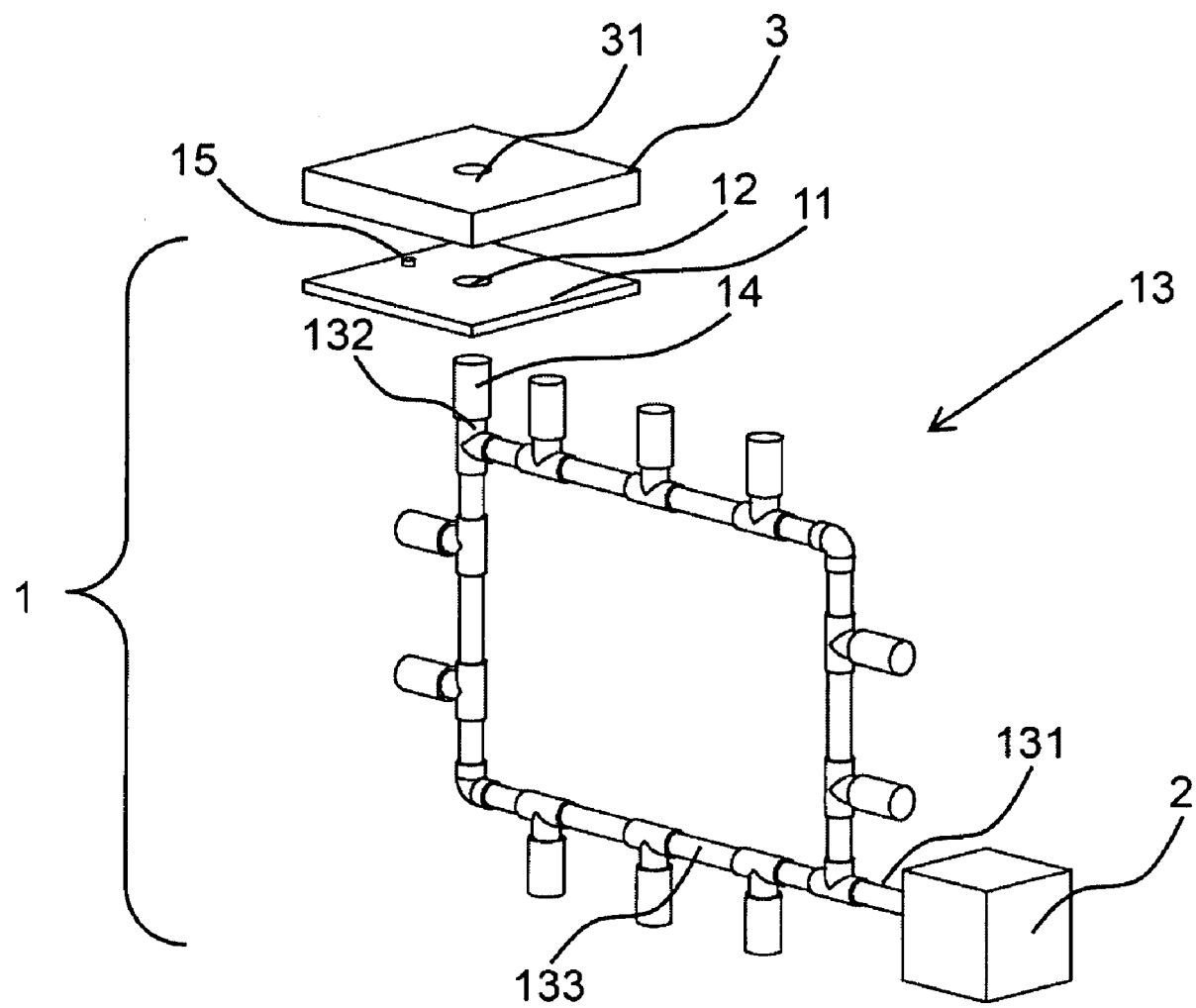
FIG. 4 is a schematic drawing of the gas filling apparatus added with a second sensing device according to the present invention.

In alternative embodiment of the present invention, a second sensing device 15 is provided to let the gas filling apparatus 1 more automatically as shown in FIG. 4. The second sensing device 15 can be disposed on the base 11 to sense the first inlet port 31 of the storage apparatus 3 that is aimed at the second inlet port 12 of the gas filling apparatus 1. When the first inlet port 31 is aligned the second inlet port 12, the second sensing device 15 can communicate the signal to the switch device 14 to turn on the switch device 14. Thus, the gas within the supply part 132 can flow through the second inlet port 12 into the storage apparatus 3.

Figure 5:
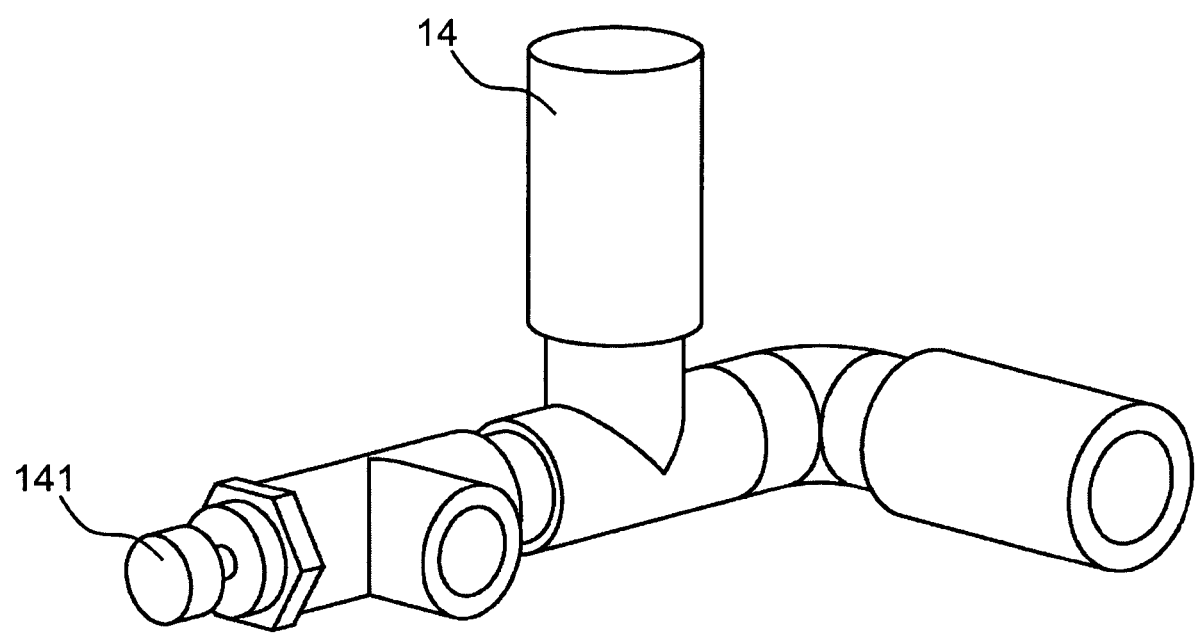
FIG. 5 is a schematic drawing of the gas filling apparatus wherein a flow rate regulator is added to the switch device according to the present invention.

Furthermore, a flow rate regulator 141 is provided to prevent the instant exploded during the switch device 14 is turned on as shown in FIG. 5. The flow rate regulator 141 can adjust the gas flow rate that flowed into the storage apparatus 3 when the switch device 14 is turned on.

Figure 6:
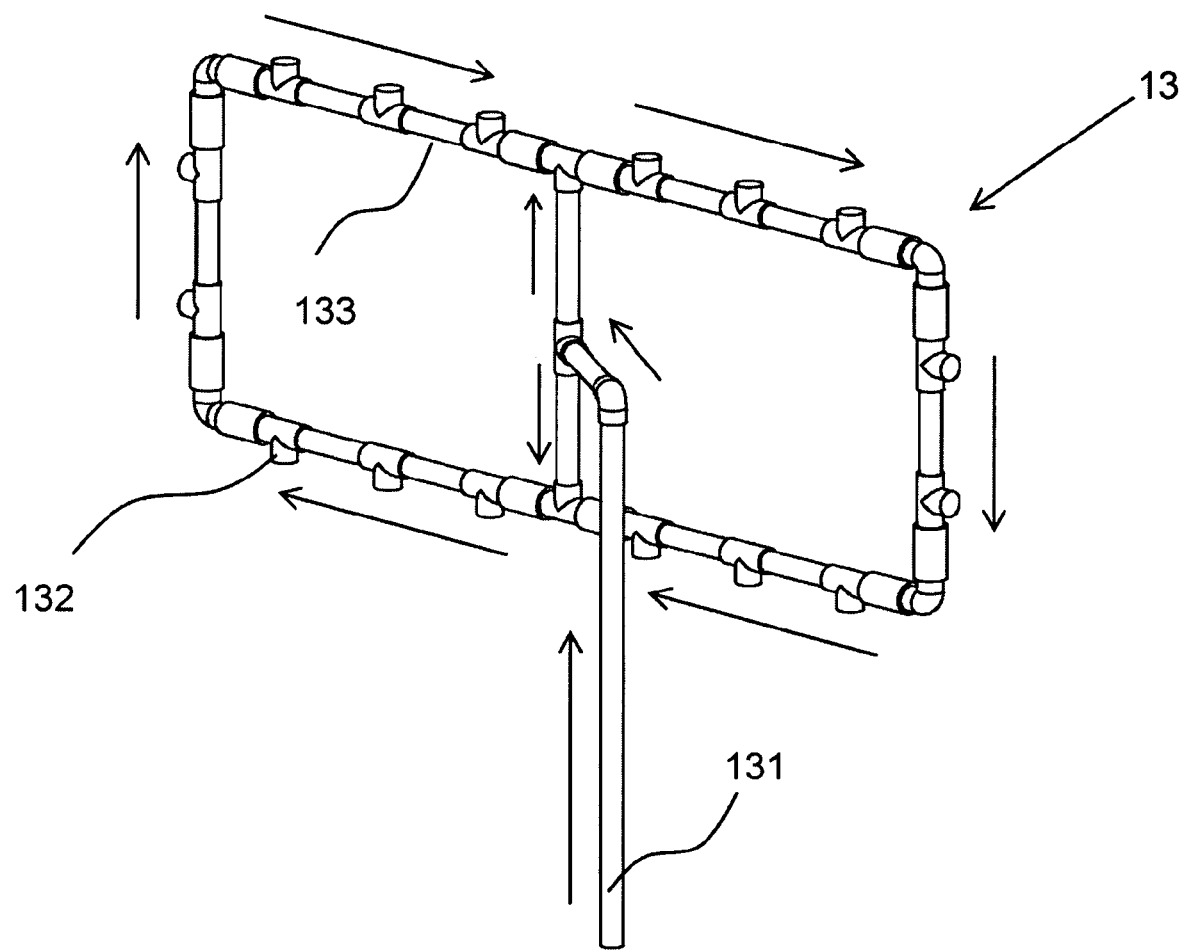
FIG. 6 is a schematic drawing of the gas filling apparatus showing that a branch part thereof comprises more than two loops communicated with each other according to the present invention.
Figure 7:
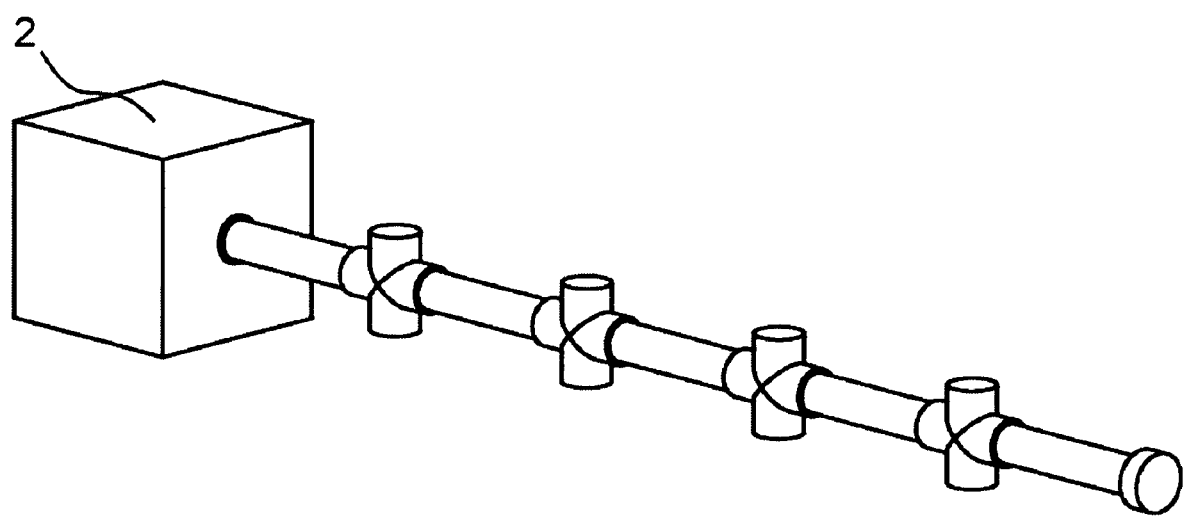
FIG. 7 is a schematic drawing of a conventional gas filling route.

Next, the key feature of the present invention is that the branch part 133 of the set of air feed source route 13 is a closed loop, so as to the pressure within the entire of the closed loop can be kept stabilized. In this embodiment, the branch part 133 can be design as a single loop or more than two loops that is communicated with each other as shown in FIG. 6.

Although the particular embodiments of the invention have been described in detail for purposes of illustration, it will be understood by one of ordinary skill in the art that numerous variations will be possible to the disclosed embodiments without going outside the scope of the invention as disclosed in the claims.

What is claimed is:

1. A gas filling apparatus, connected with an air feed source for introducing a gas into a storage apparatus that is used for storing a semiconductor element or a reticle, wherein said storage apparatus comprises at least one first inlet port, and said gas filling apparatus comprises:

at least one base, for holding said storage apparatus;

at least one second inlet port, which is set on said base and corresponds with said first inlet port of said storage apparatus; and a set of air feed source routes including, which comprises:

an entrance part, connected with said air feed source;

at least one supply part, connected with said second inlet port; and a branch part, introducing said gas from said entrance part into said supply part and forming a circulation loop so that a pressure of said gas flowing inside the circulation loop is constant.

2. The gas filling apparatus of claim 1, further comprising a pressure stabilizer disposed on said entrance part of said set of air feed source routes to adjust a pressure and a flow rate of said gas within said set of air feed source routes.

3. The gas filling apparatus of claim 2, further comprising a first sensing device disposed on said entrance part of said set of air feed source routes for sensing the pressure and flow rate of said gas within said set of air feed source routes.

4. The gas filling apparatus of claim 3, wherein said first sensing device communicates a result of said pressure and said flow rate which is sensed from said gas within said set of air feed source routes to said pressure stabilizer to adjust said pressure and flow rate of said gas within said set of air feed source routes.

5. The gas filling apparatus of claim 1, further comprising a switch device connected with said supply part of said set of air feed source routes to turn on or turn off said gas introduced into said storage apparatus.

6. The gas filling apparatus of claim 5, wherein the switch device is an electromagnetic valve.

7. The gas filling apparatus of claim 5, wherein when said first inlet port of said storage apparatus is aligned with said second inlet port of said gas filling apparatus, said switch device would be turned on to pass said gas into said storage apparatus.

8. The gas filling apparatus of claim 5, further comprising a second sensing device disposed on said base for sensing whether the first inlet port of said storage apparatus is aligned with said second inlet port of said gas filling apparatus.

9. The gas filling apparatus of claim 8, wherein when said first inlet port of said storage apparatus is aligned with said second inlet port of said gas filling apparatus, said second sensing device communicates a signal to said switch device to turn on said switch device so that said gas is flowed through to enter into said storage apparatus.

10. The gas filling apparatus of claim 5, wherein said switch device includes a flow rate regulator to adjust said flow rate of said gas filled into said storage apparatus.

11. A gas filling apparatus, connected with an air feed source for filling a gas into a storage apparatus that is used for storing a semiconductor element or a reticle, wherein said storage apparatus comprises at least one first inlet port, and said gas filling apparatus comprises:

at least one base, for holding said storage apparatus;

at least one second inlet port, which is disposed on said base and corresponds with said first inlet port of said storage apparatus;

a set of air feed source routes, which comprises:
an entrance part, connected with said air feed source;
at least one supply part, connected with said second inlet port; and
a branch part, introducing said gas from said entrance part into said supply part and forming a circulation loop so that a pressure of said gas flowing inside the circulation loop is constant;

a switch device, connected with said entrance part of said set of air feed source routes, which is turned on to pass said gas into said storage apparatus; and a second sensing device, disposed on said base for sensing whether said first inlet port of said storage apparatus is aligned with said second inlet port of said gas filling apparatus;

wherein when said first inlet port of said storage apparatus is aligned with said second inlet port of said gas filling apparatus, said second sensing device communicates a signal to said switch device to turn on said switch device so that said gas is allowed to enter into said storage apparatus.

12. The gas filling apparatus of claim 11, further comprising a pressure stabilizer disposed on said entrance part of said set of air feed source routes to adjust a pressure and a flow rate of said gas within said set of air feed source routes.

13. The gas filling apparatus of claim 12, further comprising a first sensing device disposed on said entrance part of said set of air feed source routes for sensing said pressure and said flow rate of said gas in said set of air feed source routes.

14. The gas filling apparatus of claim 13, wherein said first sensing device communicates a result to said pressure stabilizer, so that said pressure stabilizer can adjust the pressure and said flow rate of said gas within said set of air feed source routes.

15. The gas filling apparatus of claim 11, wherein said switch device is an electromagnetic valve.

16. The gas filling apparatus of claim 11, wherein said switch device further comprises a flow rate regulator to adjust said flow rate of said gas that filled into said storage apparatus.

17. A gas filling apparatus, connected with an air feed source for filling a gas into a storage apparatus that is used for storing a semiconductor element or a reticle, wherein said storage apparatus comprises at least one first inlet port and the gas filling apparatus comprises:

at least one base, for holding said storage apparatus;

at least one second inlet port, which is disposed on said base and corresponds with said first inlet port of said storage apparatus;

a set of air feed source routes, which comprises:
an entrance part, connected with said air feed source;
at least one supply part, connected with said second inlet port; and
a branch part, introducing said gas from said entrance part into said supply part and forming a circulation loop so that a pressure of said gas flowing inside the circulation loop is constant;

a pressure stabilizer, disposed on said entrance part of said set of air feed source routes to adjust a pressure and a flow rate of said gas within said set of air feed source routes;

a first sensing device, disposed on said entrance part of said set of air feed source routes for sensing said pressure and said flow rate of said gas in said set of air feed source routes, wherein said first sensing device communicates a result to said pressure stabilizer, so that said pressure stabilizer can adjust said pressure and said flow rate of said gas within said set of air feed source routes; and a switch device, connected with said supply part of said set of air feed source routes to turn on or turn off said gas introduced into said storage apparatus, and said switch device includes a flow rate regulator to adjust said flow rate of said gas filled into said storage apparatus.

* * * * *